United States Patent [19]

Urbanik

[11] Patent Number: 4,555,302

[45] Date of Patent: Nov. 26, 1985

[54] METHOD AND APPARATUS FOR ULTRASONIC ETCHING OF PRINTING PLATES

[76] Inventor: John C. Urbanik, R.D. #1 3451 Stone Quarry Rd., Fredonia, N.Y. 14063

[21] Appl. No.: 644,177

[22] Filed: Aug. 24, 1984

[51] Int. Cl.[4] .................. B44C 1/22; C03C 15/00; C03C 25/06; B41C 1/00
[52] U.S. Cl. ..................... 156/637; 134/34; 134/198; 156/345; 156/640; 156/659.1; 156/905; 430/310
[58] Field of Search ............. 156/345, 637, 639, 640, 156/654, 655, 659.1, 905; 134/34, 36, 86, 122 P, 198; 430/300, 302–310

[56] References Cited

U.S. PATENT DOCUMENTS

| | | | |
|---|---|---|---|
| 1,081,290 | 12/1913 | Albert | 156/345 X |
| 2,566,615 | 9/1951 | Keilholtz et al. | 41/42 |
| 3,222,221 | 12/1965 | Branson | 134/1 |
| 3,265,546 | 8/1966 | Medford | 156/3 |
| 3,276,927 | 10/1966 | Medford | 156/3 |
| 3,411,999 | 11/1968 | Weinberg | 204/141 |
| 3,483,049 | 12/1969 | Grubbe | 156/5 |
| 3,499,792 | 3/1970 | Veith | 134/1 |
| 3,527,607 | 9/1970 | Antonevich | 134/1 |
| 3,538,886 | 11/1970 | Patterson | 118/73 |
| 3,572,352 | 3/1971 | Koopman | 134/122 |
| 3,635,711 | 1/1972 | Miller et al. | 96/35.1 |
| 3,661,660 | 5/1972 | Wessells et al. | 156/345 X |
| 3,677,848 | 7/1972 | Stoller et al. | 252/79.3 X |
| 3,702,795 | 7/1972 | Wessells et al. | 156/345 |
| 3,732,133 | 5/1973 | Schwartz | 156/345 X |
| 3,767,491 | 10/1973 | Chough | 252/79.4 X |
| 3,824,137 | 7/1974 | Bok et al. | 134/34 X |
| 3,833,436 | 9/1974 | Hillis et al. | 252/79.1 X |
| 3,849,135 | 11/1974 | Karlikowski et al. | 96/36 |
| 3,849,195 | 11/1974 | Powell et al. | 134/1 |
| 3,849,196 | 11/1974 | Halloway et al. | 134/1 |
| 3,880,409 | 4/1975 | Bok et al. | 134/191 X |
| 4,194,922 | 3/1980 | Gransell et al. | 134/1 |

FOREIGN PATENT DOCUMENTS 1276522 6/1972 United Kingdom .
2075372 11/1981 United Kingdom .
2120581 12/1983 United Kingdom .

OTHER PUBLICATIONS

Interim Manual, The NP Series of Energy Efficient Processors, p. 16.
Descriptive Bulletin, 80–359, Westinghouse Electric Corp., Aug. 1981, pp. 1–8, Ultrasonic Cleaning Equipment.

Primary Examiner—William A. Powell
Attorney, Agent, or Firm—Christel, Bean & Linihan

[57] ABSTRACT

Method and apparatus for etching light-sensitive photopolymerizable surfaces of printing plates. The apparatus includes a bath of etching fluid (32), a conveyor (38,40,42,52) for conveying printing plates (10) in a prescribed path (54), and transducers (46) mounted above the plates as they are conveyed within the bath and capable of forming longitudinal waves in the etching fluid at generally right angles to the surface of the printing plates. The invention is characterized by directing cleaning fluid between the acoustical radiating surface of the transducers (46) and the surface of the plates (10) in such a manner that the surface to be etched is swept with cleaning fluid of a sufficient velocity and volume as to prevent substantial cavitational erosion of the surface to be etched.

13 Claims, 6 Drawing Figures

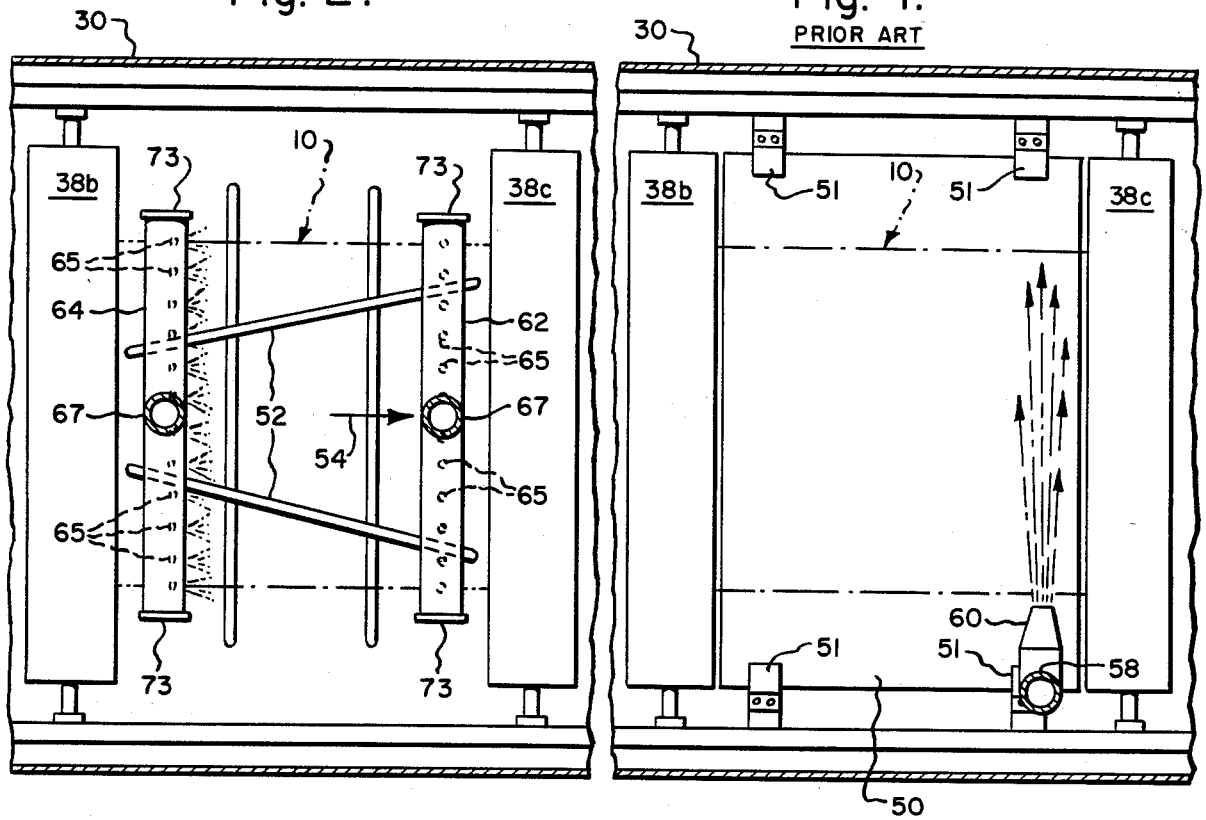
Fig. 2.
Fig. 4. PRIOR ART
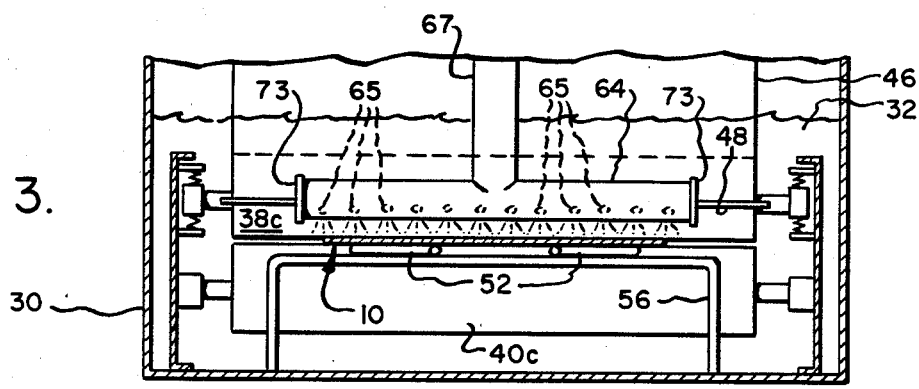
Fig. 3.
Fig. 5. PRIOR ART

METHOD AND APPARATUS FOR ULTRASONIC ETCHING OF PRINTING PLATES

FIELD OF THE INVENTION

The present invention relates generally to etching of printing plates, and more particularly to a method and apparatus for ultrasonically etching a light-sensitive photopolymerisable surface of a printing plate after exposure.

BACKGROUND OF THE INVENTION

In the printing art it is common practice to use photopolymerized materials as a medium to convey art designs by means of a relief image. The artwork, as contained on photographic film negatives, is transferred to the polymer plate by exposure with an ultraviolet light source. This exposure renders the image area to be retained insoluble. The plate is further processed by removing or etching away the soluble polymer through conventional means as established in the prior art. This consists of using a mechanical means such as spray, blotter, sponge or brush to aid the etching process. Because these methods require physical contact with the delicate image area on the plate, they can cause damage to the image areas.

Further efforts in the prior art include U.S. Pat. Nos. 3,702,795 and 3,661,660 which teach using a deep tank containing liquid bath, ultrasonic generators and suitable means for mechanical agitation of the plate. While those patents represent improvement over prior art, the apparatus required relatively long ultrasonic exposure times to be practical. This is due to the relatively long distance between the plate and the ultrasonic source of energy.

A further method of ultrasonic etching includes UK Pat. No. 2,075,372 consisting of a submerged source of ultrasonic energy radiating in all directions at a given distance from the material being etched. While this apparatus provides for a continuous process, the source of energy is again located at a substantial distance from the source.

A further method of ultrasonic etching includes UK Pat. No. 2,120,581 consisting of a tank filled with liquid subjected to ultrasonic energy in the conventional manner.

The possibility of excessive cavitational damage exists in all of the prior art ultrasonic applications when applied to delicate materials such as printing plates.

SUMMARY AND OBJECTS OF THE INVENTION

The foregoing deficiencies of the prior art are overcome in the present invention whereby the photopolymer plates can be exposed to high density power levels of ultrasonic energy in close proximity to the source without the risk of cavitational damage.

It is the object of this invention to provide a new means of controlling the ultrasonic wave in applications of liquids subjected to cavitation.

It is a further object of this invention to provide a suitable apparatus for implementing control of the sound wave.

Yet another object of this invention is to improve the speed of processing plates over conventional methods by an increase in etching rate.

An additional object of this invention is to provide a mechanically simplified apparatus which will reduce the number of rejected plates over conventional methods.

The above objects and additional objects and advantages of this invention are achieved in the following manners by providing a bath of etching fluid, conveying the printing plates to be etched in a prescribed path in the etching fluid, mounting an ultrasonic transducer with its acoustical radiating surface in the bath of etching fluid above the prescribed path in such a manner that during operation of the ultrasonic transducer, longitudinal waves are formed in the etching fluid which are generally at right angles to the surface of the printing plate, and also by sweeping the surface to be etched with a flow of etching fluid at a substantial angle to the longitudinal waves and of a sufficient velocity and volume to prevent substantial cavitational erosion of the surface to be etched.

The foregoing objects and advantages of the present invention will be more fully understood after a consideration of the following detailed description taken in conjunction with the accompanying drawings in which a preferred form of this invention is illustrated.

BRIEF DESCRIPTION OF THE DRAWINGS

FIGS. 2 and 3 are sectional views taken along the lines 2—2 and 3—3 in FIG. 1.

FIGS. 4 and 5 are representative views corresponding generally to FIGS. 2 and 3 which show unpatented prior art.

DETAILED DESCRIPTION

Figure 1A:
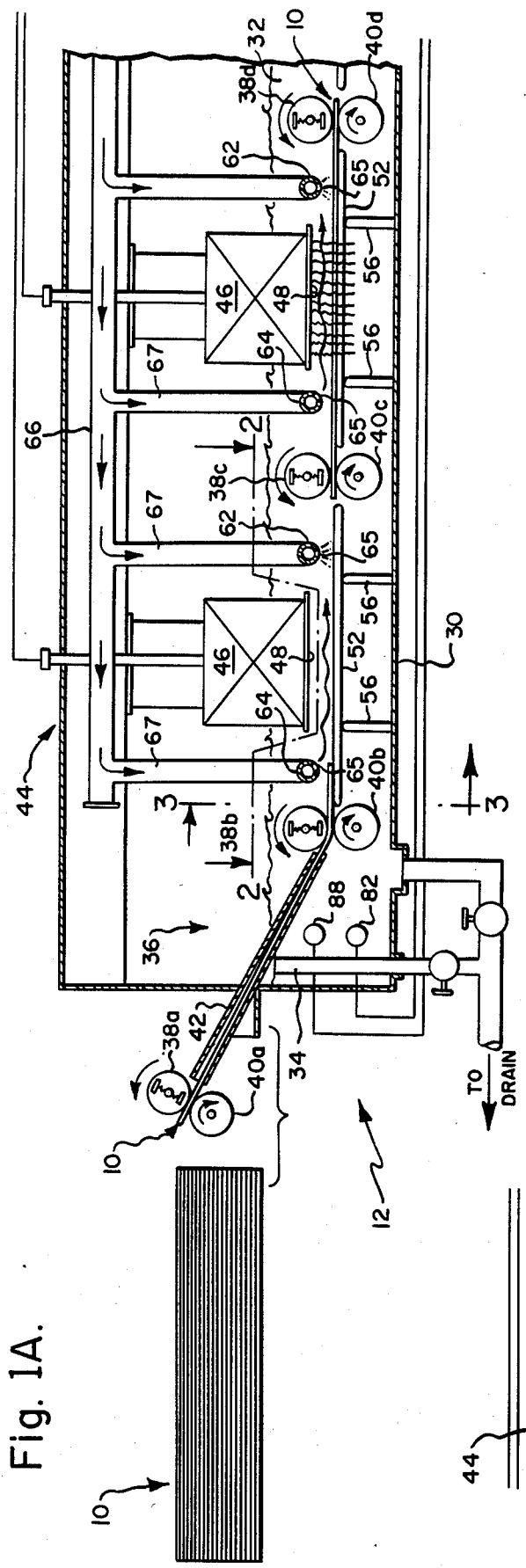
FIGS. 1A and 1B are somewhat simplified side views of an apparatus for etching printing plates in which the principles of this invention are embodied, with FIG. 1A showing the left hand side, and FIG. 1B showing the right hand side.
Figure 1B:
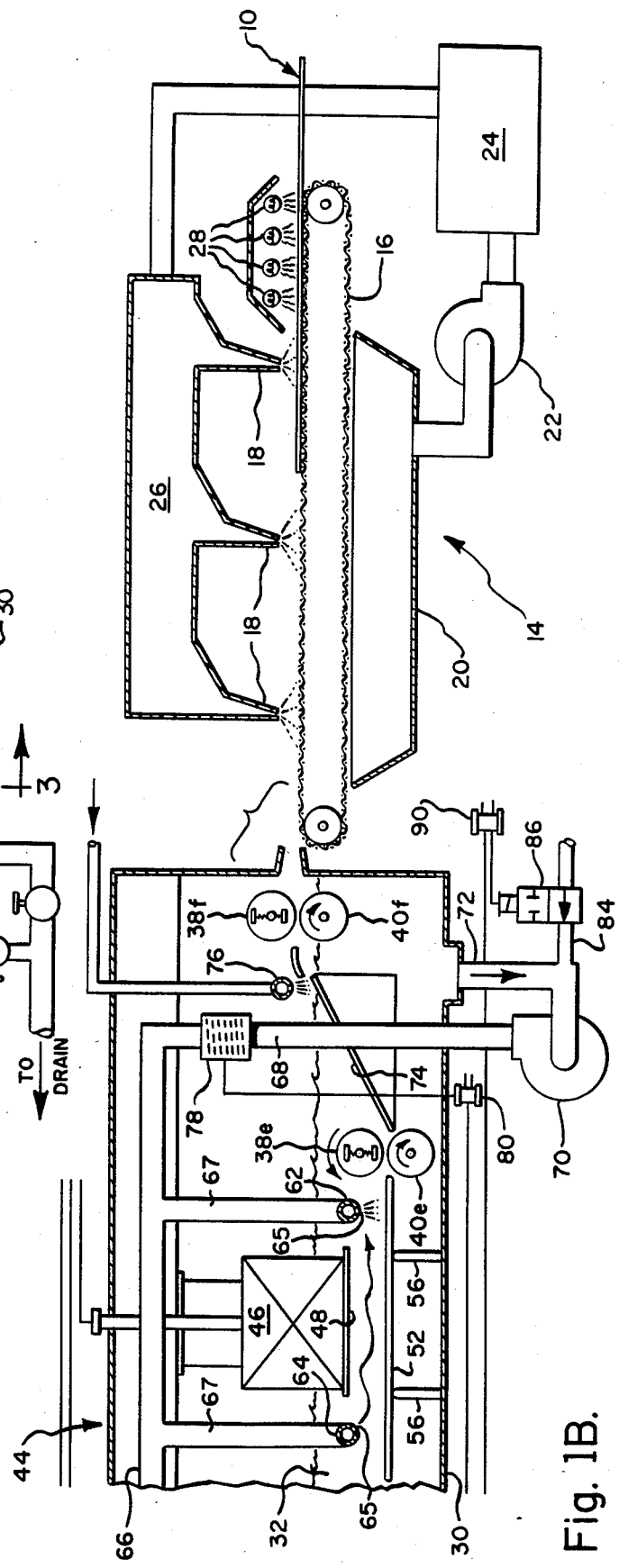

Referring now in greater detail to FIGS. 1A and 1B, a plate processing apparatus is illustrated, that apparatus being a modified NP120 Plate Processor produced by Napp Systems, Inc. of San Marcos, Calif. with the plate processing apparatus having been modified to incorporate the features of this invention. The Napp NP120 Plate Processor, prior to modification, utilized brushes to provide a mechanical agitation of the surface of the plates to be etched, which brushes are not shown in FIG. 1 as they are not needed in the modified machine. As illustrated, FIG. 1 shows a supply of exposed printing plates, indicated generally at 10, the upper surface of each printing plate requiring etching. To the right of the printing plates is illustrated the plate processing apparatus of this invention, and it should be noted that the plates to be processed are conveyed through the apparatus from the left to the right as shown in this drawing. The apparatus includes an etching station, indicated generally at 12, and a plate drying and hardening station, indicated generally at 1 in FIG. 1B. The plate drying and hardening station, which does not differ from the prior art, includes a chain type conveyor 16 which conveys printing plates 10 initially past and air knife (not shown) and a plurality of vents 18 through which heated air is discharged, the air in turn being collected by a collector 20 and recirculated by a blower 22 past a heater 24 and back into the vent header 26. After the plates 10 have been dried, they are then conveyed under a plurality of ultraviolet lights 28 which additionally harden the material remaining on the plates.

Typical plates utilized with the equipment shown in FIG. 1 may be N4-D photopolymer plates manufactured by Napp Systems, Inc., the plates being approximately 14"×23½" in size and having a 0.02" thick photopolymer on a flexible aluminum backing substrate. A comparable printing plate is produced by BASF Systems Corp. of Bedford, Mass. under their product designation WD72-65708.

The etching station includes a covered tank 30 which is capable of receiving a bath of cleaning fluid indicated at 32. A preferred cleaning fluid is water. The upper level of the cleaning fluid 32 within the tank 30 is established by a stand pipe 34. Extending from the supply of printing plates 10 into and through the etching station is a conveying means indicated generally at 36. The conveying means is capable of conveying the printing plates in a prescribed path with the plate surface to be etched, namely the upper surface, being in contact with the cleaning fluid 32 in the tank 30. The conveyor means includes six sets of upper and lower soft rubber rollers 38,40, respectively. The upper rollers 38 are spring mounted and are normally biased into contact with the lower rollers but may be moved in an upward direction upon the introduction of a printing plate between the bite of the rollers. The conveying means further includes a guide 42 which guides the printing plates 10 into the tank and also into the bite of the second set of rollers, 38b, 40b. Disposed within the tank are a plurality of work stations indicated generally at 44, each work station being disposed between a pair of upper and lower rollers. Thus, as shown in FIG. 3, three work stations are present. However, as above, FIGS. 1A and 1B are simplified illustrations, and the actual machine, as modified by this invention, has two side-by-side conveyors, there being three work stations for each conveyor.

In accordance with the principles of this invention, each work station consists of an ultrasonic transducer 46, the acoustical radiating surface of which is disposed below the surface of the cleaning fluid 32. The ultrasonic transducers may be "Magnapak" model 1820 immersible magnetostrictive transducers manufactured by the Westinghouse Electric Corporation of Sykesville, Md. The transducers each have a 1000 watt power input and their output frequency is at 20 kHz. Each transducer is in turn powered from a "Magnatrak" heavy duty generator, such as for example a model G2KA/C, also produced by Westinghouse.

In the prior art, Napp NP120 Plate Processor, a support plate 50 (FIG. 4) was located at each work station, the support plate being approximately ¼" thick stainless steel and extending the full width of the rollers 38,40 and also extending from locations closely spaced between the exit from one pair of rollers and the entrance to the next pair of rollers. The plate 50 was in turn supported by brackets 51. This form of support means, below an ultrasonic transducer, was not found to be satisfactory. Therefore, a new printing plate support design has been developed, the new printing plate support means consisting of a pair of rails 52 at each station, the rails extending at an angle to the prescribed path of the conveying means 36, the path being indicated by the arrow 54. As can be seen from FIG. 2, which is drawn generally to scale, the rails lie at an angle of between 5°-35°, the preferred angle being approximately 9°-10° to the prescribed path 54. The rails 52 are in turn supported on inverted U-shaped support members 56, the lower ends of which are secured to the bottom of the tank in a conventional manner.

In an earlier design modification of the Napp NP 120 Plate Processor, it was proposed to utilize transducers of the character set forth above. It was found though that the plates produced by the process were unsatisfactory as excessive pitting was noted on the surface of the plates. It was believed that the excessive pitting was due to small particles of polymer being in the cleaning fluid, which small particles were impressed into the surface of the plates as the plates passed between conveying rollers 38,40. Accordingly, it was proposed to flush the surface of the plate as it exited from beneath the transducer with cleaning fluid to remove the particles and prevent damage to the plates. One such design is shown in FIGS. 4 and 5 wherein piping 58 terminating in a nozzle 60 was disposed to one side of the printing plates, cleaning fluid being pumped through the piping and nozzle and being adapted to flush the surface of the plate. Satisfactory results were not achieved by this procedure. Subsequently, it was proposed to flush the plates in a slightly differing manner and to this end, transverse pipes 62 were positioned to the rear (to the right) of each transducer 46, the pipes 62 (shown in FIG. 1) being provided with a plurality of downwardly directed nozzles (not shown) which would cause the cleaning fluid to impinge upon the surface of the printing plate as it passed below each pipe 62. Again, satisfactory results were not achieved. Up to this point in time the surface of the plate to be cleaned was maintained at a distance from the acoustical radiating surface as to cause maximum cavitation in the surface of the plate, as it is customarily believed that cavitation is essential to the cleaning process.

In accordance with the principles of this invention it was theorized by the applicant that the pitting of the plates was not due to small particles being impressed upon the surface of the plate, but that the relatively soft polymer was being torn apart by the cavitational energy imparted to the surface of the plates. Therefore, in order to break up the longitudinal waves which extend away from the acoustical radiating surface of the transducer and thereby reduce cavitational damage to the plates, it was proposed to sweep the surface of the printing plate to be etched with a flow of etching fluid at a substantial angle to the longitudinal waves and of a sufficient velocity and volume to prevent substantial cavitational erosion to the surface to be etched.

In order to accomplish the above results, transverse pipes 64 were located to the forward side (to the left in FIG. 1) of each transducer, each of the transverse pipes 64 being provided with a plurality of apertures 65 which directed cleaning fluid at an angle of approximately 45° to the vertical, the cleaning fluid passing under the leading edge of the transducer and having a generally rearwardly flow under the transducer to thereby breaking up the longitudinal waves. In one embodiment the apertures have been formed by drilling the pipe with a number 45 drill at 1½" spaced intervals, there being 12 apertures formed for cleaning a 14" wide printing plate. As it is theoretically possible for air to be entrained by the vortex created when using high flow rates, it is possible that larger aperture sizes may be desired. The flow through the pipes 64, as well as through the pipes 62, is from a common header 66 and T's 67, the header in turn receiving cleaning fluid through vertical pipe 68, pump 70 and drain 72. Each of the pipes 62, 64 is closed at its ends by caps 73.

After the plates have been processed underneath the ultrasonic transducers 46, the plates are elevated up a ramp 74, past a wash pipe 76 which washes the plates with cleaning fluid, the plates then exiting into the plate drying and hardening station 14. It should be noted that a certain amount of cleaning fluid is carried out of the etching station 12 to the plate drying and hardening station 14, however, a certain amount of new cleaning fluid is introduced into the etching station through the cleaning pipe 74 which, to a large extent, is similar to the pipes 62.

As is well known, when processing printing plates of the type described, it is desirable that the temperature of the cleaning fluid be maintained in the range of approximately 124°–142° F. In the Napp NP 120 Plate Processor, as there is virtually no energy input into the tank, it is necessary to provide heaters, (not shown) associated with the line to wash pipe 76, which heaters are controlled by a heating relay 80 and a thermostat 82 or the equivalent. In addition, the temperature of the water in the tank prior to start up is typically brought up to the operating temperature by introducing fresh mixed hot and cold tap water. In the new design a thermostatically controlled heater 78 may be associated with pipe 68. Due to the high energy input of the transducers 46, in the new design, it has been found that it is necessary to cool the water after start up temperature has been attained. Also. as "de-gassed" water should be utilized in the processing of the plates, it is preferred not to drain the tank after use, as was the prior practice but to maintain the de-gassed water in the tank. "De-gassed" water is water in which all or virtually all dissolved gasses have been removed. Such dissolved gasses will interfere with the preferred operation of the ultrasonic transducers 46; as a cleaning process utilizing ultrasonics is more effective in a degassed fluid than in one containing absorbed gas. In order to provide for suitable cooling, it is proposed to introduce tap water at ambient temperature. To this end, a makeup water line 84 is connected to the drain 72 upstream of the pump, there being a solenoid operated two position valve 86 disposed within the line and which is capable, when in one position, of blocking the flow of water through the line and, when in the other position, of permitting flow of water through the line, the line 84 in turn being connected to a source of tap water. The operation of the valve 86 is controlled in turn by a thermostat or equivalent 88 and a cooling relay 90. While separate themostats 82, 88 and relays 80, 90 have been illustrated, these units may be combined.

Various tests have been conducted to determine to the extent possible the optimum operating conditions within the modified Napp NP 120 Plate Processor. One of these tests related to the amount of dissolved polymer within the cleaning fluid, as satisfactory etching cannot be achieved after the etching fluid has become excessively contaminated by dissolved polymer. The typical manner in which the dissolved polymer is measured is by the conductivity of the cleaning fluid. In the following test, no makeup water was added to the system, and 60 gallons per minute were circulated by the pump 70 at 30 PSI. The test results are as follows:

| Number of Plates | Tank Temperature | Transport Speed Setting | Conductivity (MICRO MHOS) |
|---|---|---|---|
| 1 | 124 | 25"/min. | 300 |
| 8 | 130 | 25"/min. | 320 |
| 16 | 133 | 25"/min. | 340 |
| 24 | 136 | 25"/min. | 360 |
| 32 | 137 | 25"/min. | 360 |
| 40 | 133 | 25"/min. | 340 |
| 50 | 135 | 25"/min. | 360 |
| 60 | 137 | 25"/min. | 360 |
| 70 | 136 | 25"/min. | 360 |
| 100 | 138 | 25"/min. | 460 |
| 130 | 138 | 25"/min. | 480 |

Beyond 480 micro mhos, washout was incomplete at a transport speed of 25" per minute and at a temperature of 136° F. By adding 14 gallons of clean water to a tank volume of 91 gallons, the concentration of polymer was reduced to 440 micro mhos. The readings set forth above were taken over 2.75 hours. Thus, it can be seen that 5.1 gallons per hour of makeup liquid will prevent the solution concentration from disrupting machine operation. It can also be seen from the above data that the tank temperature increased 14° during the 2.75 hour test period. It has been calculated that, with a 6 kilowatt energy input, (from 6 transducers 46) with tap water of 70°, and a desired operating temperature of 130°, that it will be necessary to introduce 45.5 gallons of tap water per hour. In one 4 hour test, with the tank temperature initally at 138°, 60 gallons of water per hour were introduced, the tank temperature being 142° at the conclusion of the test.

In another test, the distance of the plate from the acoustical radiating surface of the transducer was varied. The test results are as follows:

| Speed | Distance | Results |
|---|---|---|
| 25 IPM | 1⅜" | Complete Etching |
| 29 IPM | 1⅜" | Incomplete Etching |
| 25 IPM | 1⅛" | Complete Etching |
| 29 IPM | 1⅛" | Complete Etching |
| 30.5 IPM | 1¼" | Complete Etching |
| 32 IPM | 1⅛" | Complete Etching |
| 32 IPM | 1⅛" | Incomplete etching 9 plate due to increased concentration of polymer |

The initial distance of the plate surface from the acoustical radiating surface of the transducer was 1⅜", which is approximately of the maximum resonance prior to the application of the sweeping means 64. However, it has been found when sweeping the surface of a printing plate below a transducer that it is possible to move the plate closer to the acoustical radiating surface, of the transducer, thereby allowing an increase in the conveyor speed, while maintaining uniformly satisfactory plate etching results. In the above test the circulation rate was at 65 gallons per minute, measured, and makeup fluid was added as required to maintain a relatively uniform temperature. While satisfactory plate etching results were obtained at varying spacings, it was found at closer spacings that higher speeds were limited due to increased concentrations of polymer in the cleaning fluid.

In a further test, pump pressure and pump flow were varied. The test results are as follows:

| Pump Pressure Measured | Pump Flow Measured | Tank Temp | Transport Speed | Plate Results |
| --- | --- | --- | --- | --- |
| 30 PSI | 70 GPM | 125° F. | 25 IPM | Complete Etching |
| 20 PSI | 58 GPM | 127° F. | 25 IPM | Complete Etching |
| 10 PSI | 40 GPM | 127° F. | 25 IPM | Complete Etching |

Further testing discontinued. 380u U conductivity at end of 28 plates.

In another test, mechanical circulation of the fluid alone was utilized at 115° F., the circulation rate being at 60 gallons per minute and the conveyor speed being set at 24" per minute. As a result of this test, it was noted that 0.008" of etching was achieved by mechanical circulation. From this, it was calculated that 0.018" of material was removed by the energy imparted by the transducers 46.

In all of the tests mentioned above, Napp type N4-D plates were utilized.

By utilizing the process described above, it has been possible to provide a somewhat simplified plate processing apparatus of more reliable design (i.e. less down time), and also to provide better quality of plates at a greater throughput.

While a preferred structure in which the principles of the present invention have been incorporated as shown and described above, it is to be understood that this invention is not to be limited to the particular details shown and described, but that, in fact, widely differing means may be employed in the broader aspects of this invention.

I claim:

1. In a process for etching a light-sensitive photopolymerisable surface of a printing plate after exposure including the following steps:
   providing a bath of etching fluid;
   conveying a printing plate in a prescribed path with at least a surface to be etched being in contact with the bath of etching fluid;
   forming longitudinal waves in the etching fluid at generally right angles to the surface of the printing plate, the waves being of a suitable wave length and amplitude to normally cause substantial cavitation adjacent the surface of the printing plate to be etched;
   the improvement being characterized by
   sweeping the surface to be etched with a flow of etching fluid at a substantial angle to the longitudinal waves and of a sufficient velocity and volume to prevent substantial cavitational erosion of the surface to be etched.

2. In the process for etching a printing plate as set forth in claim 1 wherein the temperature of the etching fluid is maintained after start up by introducing makeup etching fluid at a lower temperature than the temperature to be maintained and at a rate established to maintain the desired temperature in the etching fluid, and dumping excess etching fluid.

3. The process of etching a printing plate as set forth in claim 1 wherein the improvement further comprises progressively supporting varying widths of said printing plate as it is conveyed past said waves.

4. The process for etching a printing plate as set forth in claim 3 wherein the temperature of the etching fluid is maintained after start up by introducing makeup etching fluid at a temperature less than that temperature which is to be maintained at a rate established to maintain the desired temperature, and dumping excess etching fluid.

5. In an apparatus for etching a light-sensitive photopolymerisable surface of a printing plate after exposure; said apparatus including a tank capable of containing a bath of cleaning fluid, conveying means mounted within said tank for conveying printing plates in a prescribed path with at least said surface being in contact with the bath of cleaning fluid, and transducer means mounted at least partially within said tank above said prescribed path and capable of forming longitudinal waves in the cleaning fluid at generally right angles to the path of the printing plates, the waves being of a suitable wave length and amplitude to normally cause substantial cavitation adjacent the surface of the printing plate to be etched; the improvement being characterized by
   sweeping means for sweeping the surface to be etched with a flow of cleaning fluid at a substantial angle to said longitudinal waves and of a sufficient velocity and volume to prevent substantial cavitational erosion of the surface to be etched.

6. The apparatus for etching a printing plate as set forth in claim 5 wherein said sweeping means further includes a pump, means for introducing cleaning fluid from the tank into said pump, and a cleaning fluid discharge tube mounted with said tank at a location forwardly of said transducer means, said tube being provided with rearwardly directed aperture means, said pump in turn being connected with said discharge tube.

7. The apparatus for etching a printing plate as set forth in claim 6 wherein the discharge tube is located above said prescribed path, the disclosure tube being generally linear with an axis parallel to the surface of the plates to be cleaned, and at right angles to said prescribed path.

8. The apparatus for etching a printing plate as set forth in claim 7 wherein said discharge tube is provided with a plurality of apertures in the tube wall at a 45° angle from the bottom of said tube and extending towards said tranducer means.

9. The apparatus for etching a printing plate as set forth in claim 8 wherein said printing plates have a width of 14", said apertures in said tube being spaced 1½" apart, and extending across the length of said discharge tube above the path of the printing plate, said apertures being approximately ⅛" in diameter, and the pressure of the cleaning fluid within the discharge tube being approximately 25 PSI.

10. The process for etching a printing plate as set forth in claim 9 wherein the transducer is provided with an acoustical radiating surface disposed below the surface of the cleaning fluid, the transducer is operated at a frequency of 20kHz, and wherein the surface of the printing plate to be cleaned is conveyed 1⅜" below said acoustical radiating surface.

11. The apparatus for etching printing plates as set forth in claim 5 wherein the improvement is further characterized by temperature maintaining means including signals when the temperature of the cleaning fluid is either below or above the desired temperature, respectively, a heater capable of heating the fluid when it received a first signal from the temperature sensor, and a solenoid operated valve capable of introducing cleaning fluid at a temperature less than that desired of the cleaning fluid when it received a second signal, said bath further being provided with an overflow through which excess cleaning fluid can be dumped when cleaning fluid is introduced into the system.

12. The apparatus for etching a printing plate as set forth in claim 5 wherein printing plate support means are provided below said transducer means, the improvement further comprising forming said support means of a plurality of rails which extend at an angle between 5° and 35° to the prescribed path.

13. The apparatus for etching a printing plate as set forth in claim 12 wherein the longitudinal waves are formed by ultrasonic transducers having their acoustical radiating surfaces mounted below the surface of the cleaning fluid and disposed generally parallel to the surface of said cleaning fluid, and wherein said rails are generally parallel to said acoustical radiating surface, the surface to be etched being on the top side of said printing plates and located at a distance between 1" and 2" below the acoustical radiating surface.

* * * * *